United States Patent
Sogo et al.

(12)
(10) Patent No.: US 6,246,301 B1
(45) Date of Patent: Jun. 12, 2001

(54) HIGH-FREQUENCY CIRCUIT APPARATUS

(75) Inventors: Hiroyuki Sogo; Jun Oyama, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/272,650

(22) Filed: Mar. 18, 1999

(30) Foreign Application Priority Data

Mar. 20, 1998 (JP) .................................................. 10-072746

(51) Int. Cl.[7] ........................................................ H05K 7/02

(52) U.S. Cl. ............................ 333/185; 361/764; 361/816; 361/818

(58) Field of Search ..................................... 361/816, 818, 361/764, 753, 799, 800; 333/219, 182, 185

(56) References Cited

U.S. PATENT DOCUMENTS 6,094,350 * 7/2000 Achiriloaie ............................ 361/737

* cited by examiner

*Primary Examiner*—Arnold Kinkead
(74) *Attorney, Agent, or Firm*—Helfgott & Karas, P.C.

(57) ABSTRACT

A high-frequency circuit apparatus includes two high-frequency circuits (2, 3) mounted on a printed circuit board (1), two rows of first plated through holes (6) which connect upper and lower ground plates (4, 5) on the upper and lower surfaces of the printed circuit board (1) and which are arrayed in a first direction so that the two high-frequency circuits (2, 3) are disposed between the first plated through holes, and at least two columns of second plated through holes (7) which are arrayed in a second direction different from the first direction, between the two high-frequency circuits to connect the ground plates on the upper and lower surfaces of the printed circuit board, to thereby form a waveguide resonator. A variable capacitance diode can be provided to be connected to a conductor pattern which is electrically isolated from the ground plates and the ground plates so as to adjust the resonance frequency of the waveguide resonator.

17 Claims, 12 Drawing Sheets

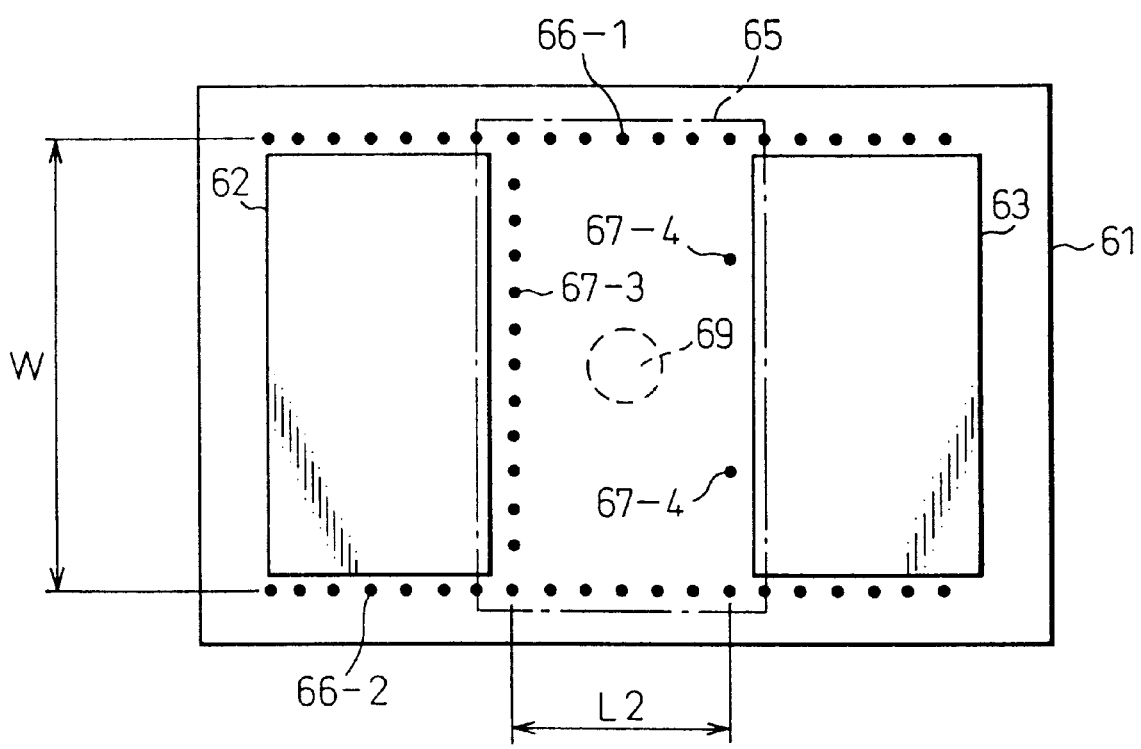

HIGH-FREQUENCY CIRCUIT APPARATUS

BACKGROUND OF THE INVENTION

1. Field of the Invention

The present invention relates to a high-frequency circuit apparatus having a printed circuit board provided with high-frequency circuits mounted thereon.

In a multiplex radio communication system, transmitter and receiver portions, such as mobile base station devices, are mounted on a single printed circuit board for the purpose of miniaturization and economy. The receiver and the transmitter mounted on the printed circuit board are isolated by a metal casing or the like. The isolation means can prevent electromagnetic coupling between the transmitter and the receiver through a space on the printed circuit board, but no electromagnetic coupling through the inside of the printed circuit board can be prevented. In particular, if the receiver is of high sensitivity, it is necessary to prevent electromagnetic coupling through the printed circuit board.

2. Description of the Related Art

In a known high-frequency circuit apparatus, an array of plated through holes is provided between the high-frequency circuits to prevent electromagnetic coupling between the high-frequency circuits.

However, only one array of the plated through hole is not enough to sufficiently reduce leakage power. To sufficiently reduce the leakage power, in the conventional high-frequency circuit apparatus, the high-frequency circuits are each covered by a metal casing to isolate them from one another. However, the isolation means such as the metal casing cannot prevent electromagnetic coupling of the circuits through the printed circuit board, as mentioned above, and the high-frequency circuit apparatus becomes large as a whole.

SUMMARY OF THE INVENTION

An object of the present invention is to provide a high-frequency circuit apparatus in which the leakage power is sufficiently reduced without using a metal casing, to thereby prevent an electromagnetic field coupling between the high-frequency circuits.

To achieve the object of the invention, according to a first aspect of the present invention, there is provided a high-frequency circuit apparatus comprising two rows of first plated through holes which connect upper and lower ground plates on the upper and lower surfaces of a printed circuit board and which are arrayed in a first direction so that two high-frequency circuits are disposed between the first plated through holes, and at least two columns of second plated through holes which are arrayed in a second direction different from the first direction, between the two high-frequency circuits to connect the ground plates on the upper and lower surfaces of the printed circuit board.

The rows of the first plated through holes and the ground plates constitute a waveguide which prevents interference with an external signal of the high-frequency circuit apparatus and the second plated through holes, those of the first plated through holes that are located on an extension of the second plated through holes in the second direction, and the ground plates constitute a waveguide resonator whose resonance frequency is identical to an intermediate frequency of signal frequency bands of the two high-frequency circuits and which prevent signals in the signal frequency bands of the high-frequency circuits from passing therethrough.

The two rows of the first plated through holes are spaced at a first distance; the columns of the second plated through holes are spaced at a second distance; the resonance frequency of the waveguide resonator is determined in accordance with the first and second distances; and, the waveguide resonator has frequency characteristics which are determined in accordance with the number and the diameter of the second plated through holes.

Preferably, the high-frequency circuit apparatus further comprises a third plated through hole which connects the ground plates on the upper and lower surfaces of the printed circuit board in the vicinity of a point between the high-frequency circuits at which the intensity of the electric field is maximum; a conductor pattern on the upper surface of the printed circuit board, which is electrically isolated from the ground plate; and a variable capacitance diode which is connected to the third plated through hole and the conductor pattern and whose capacitance is varied in accordance with a bias voltage applied to the conductor pattern.

According to a second aspect of the present invention, there is provided a high-frequency circuit apparatus comprising two rows of first plated through holes which connect upper and lower ground plates on upper and lower surfaces of a printed circuit board and which are arrayed in a first direction so that two high-frequency circuits are disposed between the first plated through holes; at least one row of second plated through holes which are arrayed in parallel with the first plated through hole, between the two high-frequency circuits to connect the ground plates on the upper and lower surfaces of the printed circuit board; two columns of third plated through holes which connect the ground plates on the upper and lower surfaces of the printed circuit board and which are arrayed in a second direction different from the first direction, between the two high-frequency circuits and between one of the two rows of the first plated through holes and the second plated through holes to prevent signal interference between the two high-frequency circuits; and fourth plated through holes which connect the ground plates on the upper and lower surfaces of the printed circuit board and which are arrayed in the second direction different from the first direction, between the two high-frequency circuits and between the two other row of the first plated through holes and the second plated through holes to prevent signal interference between the two high-frequency circuits.

According to a third aspect of the present invention, there is provided a high-frequency circuit apparatus comprising two rows of first plated through holes which connect upper and lower ground plates on upper and lower surfaces of a printed circuit board and which are arrayed in a first direction so that two high-frequency circuits are disposed between the first plated through holes; second plated through holes which connect the ground plates on the upper and lower surfaces of the printed circuit board and which are arrayed to define a rectangle of which one side is defined by one of the two rows of the first plated through holes; and a coupling window opposed to a space defined between the two high-frequency circuits, on one of the rows of the first plated through holes, a width of the coupling window being greater than the distance between those of the plated through holes located on opposite sides of the high-frequency circuits.

According to a fourth aspect of the present invention, there is provided a high-frequency circuit apparatus comprising two high-frequency circuits mounted on a printed circuit board; an upper ground plate formed on an upper surface of the printed circuit board; a lower ground plate formed on a lower surface of the printed circuit board; two rows of first plated through holes which connect upper and lower ground plates on the upper and lower surfaces of the printed circuit board and which are arrayed in a first direction so that the two high-frequency circuits are disposed between the first plated through holes; an intermediate ground plate provided between the upper and lower ground plates and having at the center thereof a coupling window; at least two columns of upper plated through holes which connect the upper ground plate and the intermediate ground plate; at least two columns of lower plated through holes which connect the lower ground plate and the intermediate ground plate.

BRIEF DESCRIPTION OF THE DRAWINGS

The above object and features of the present invention will be more apparent from the following description of the preferred embodiments when read in conjunction with the accompanying drawing, wherein;

FIG. 11C is a rear view of a high-frequency circuit apparatus shown in FIG. 11B;

DESCRIPTION OF THE PREFERRED EMBODIMENTS

A known high-frequency circuit apparatus and the drawbacks to be solved therein will be discussed below prior to explaining the of embodiments of the present invention.

Figure 13A:
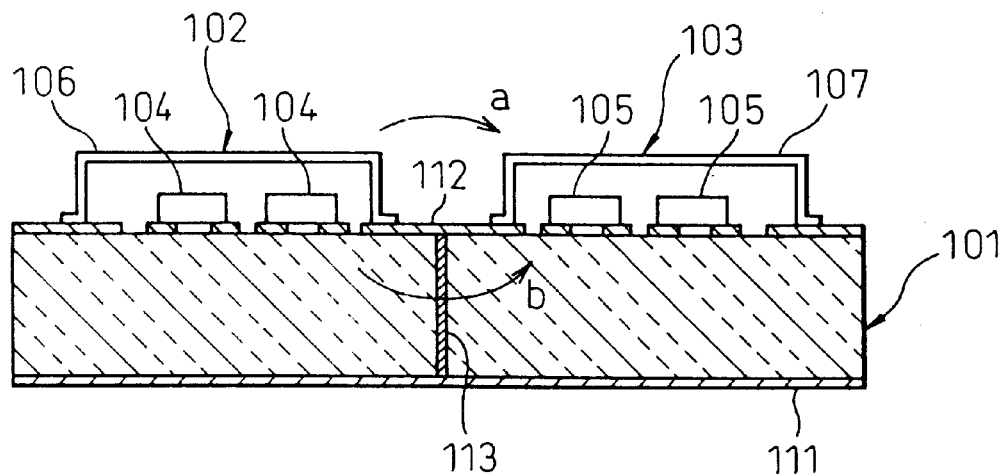
FIG. 13A is a schematic sectional view of a known high-frequency circuit apparatus; and, FIG. 13B is a schematic plan view of a high-frequency circuit apparatus shown in FIG. 13A.
Figure 13B:
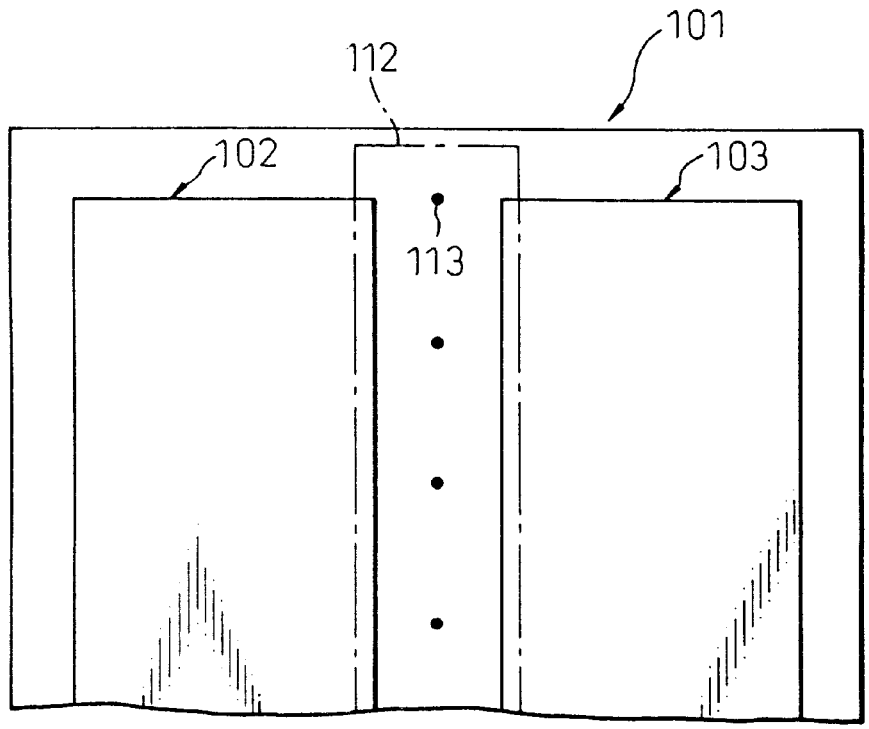

FIG. 13A shows a schematic sectional view of a known high-frequency circuit apparatus and FIG. 13B shows a schematic plan view of main elements thereof, wherein a transmitter and a receiver are provided on a printed circuit board. In the figures, 101 designates the printed circuit board, 102 the transmitter, 103 the receiver, 104 and 105 the electronic devices such as integrated circuits, 106 and 107 the metal casings, 111 the lower ground plate, 112 the upper ground plate, and 113 designates the through holes plated with a metal, respectively.

In the drawings, the lower surface of the printed circuit board 101 is made of an insulating plate, such as glass epoxy resin, on which the ground plate 111 is formed. The printed circuit board 101 is provided on the upper surface with various conductor patterns or terminals, including a connecting conductor pattern, terminals for external devices, a power source conductor pattern, and a ground plate, etc. Electronic elements including resistors, capacitors, or semiconductor ICs, etc., are mounted on the conductor patterns. These electronic elements are shielded by the metal casing 106 to form the transmitter 102. Likewise, the electronic elements 105 are mounted on the conductor pattern 112 and are shielded by the metal casing 107 to form the receiver 103. Note that although there is a single wiring layer in the illustrated apparatus, it is also known to provide a multiple wiring layer on the printed circuit board so that the electronic elements are interconnected through the multiple wiring layer to form the transmitter 102 and the receiver 103.

Also, it is known to connect the electronic elements in the space between the transmitter 102 and the receiver 103 and on the printed circuit board 101.

The electromagnetic coupling between the transmitter 102 and the receiver 103 due to leakage of high-frequency signals output from the transmitter 102 and received by the receiver 103 along the direction "a" through the space on the printed circuit board can be prevented by the metal casings 106 and 107.

However, there is a possibility that the transmitter 102 and the receiver 103 are electromagnetically coupled due to the leakage of high-frequency signals emitted from the transmitter 102 and received by the receiver 102 along the direction "b" through the inside of the printed circuit board 101. In general, for instance, in a CDMA (Code Division Multiple Access) system, the output level of the transmitter 102 is approximately in the range of 0 to 10 dBm, and the receiver 103 processes a low power signal of −70 to −100 dBm. In an FDD (Frequency Division Duplex) system, the receiver 103 which receives a signal transmitted from the transmitter 102 receives a signal of a frequency different from the frequency of the signal transmitted from the transmitter. Consequently, if the receiver 103 processes a signal of small power, as mentioned above, the electromagnetic coupling between the transmitter 102 and the receiver 103 through the printed circuit board 101 is not negligible in the high frequency band of approximately 2 GHz.

To this end, in the prior art, the metal casings 106 and 107 are provided with wave absorbers or the like, and an array of plated through holes 113 is formed between the transmitter 102 and the receiver 103. The distance between the plated through holes 113 is selected to prevent the electromagnetic coupling between the transmitter 102 and the receiver 103 through the printed circuit board 101.

However, if the transmitter 102 and the receiver 103 are located close to each other to miniaturize the high-frequency circuit apparatus, it is difficult for an array of the plated through holes 113 to effectively reduce the leakage power.

Furthermore, the separate metal casings for the transmitter 102 and the receiver 103 obstruct the miniaturization of the high-frequency circuit apparatus. Embodiments of the present invention will be discussed below.

Figure 1A:
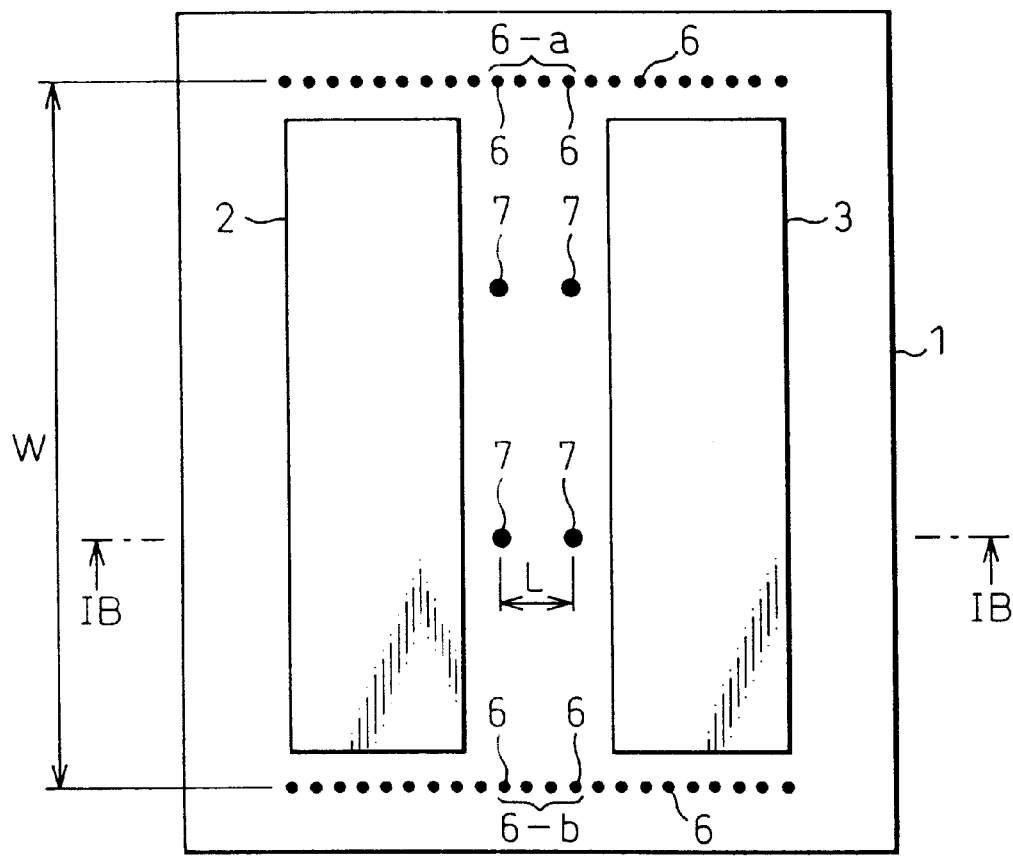
FIG. 1A is a schematic plan view of a high-frequency circuit apparatus according to a first embodiment of the present invention.
Figure 1B:
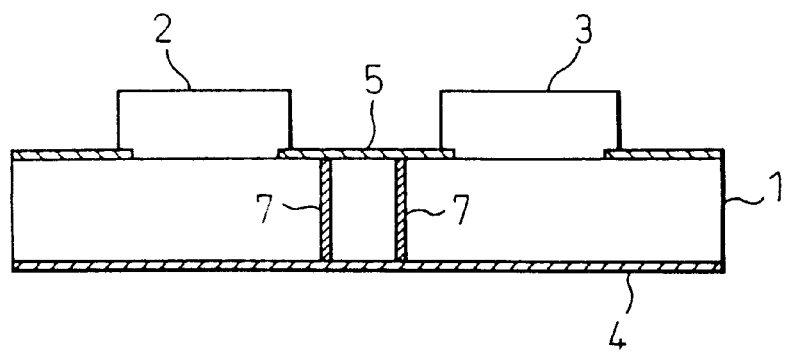
FIG. 1B is a sectional view taken along the line IB—IB in FIG. 1A.

FIG. 1A schematically shows a plan view of a high-frequency circuit apparatus according to a first embodiment of the present invention, and FIG. 1B shows a sectional view taken along the line IB—IB in FIG. 1A. In these figures, the high-frequency circuit apparatus is composed of two high-frequency circuits, i.e., a transmitter 2 and a receiver 3, provided on the printed circuit board 1, two rows of first plated through holes 6 which connect the upper and lower ground plates 4 and 5 of the printed circuit board 1 and which extend in a first direction, so that the two high-frequency circuits 2 and 3 are located between the two rows of the plated through holes 6, and at least two columns of second plated through holes 7 which are provided between the two high-frequency circuits 2 and 3 and extend in a second direction substantially perpendicular to the first direction to connect the upper and lower ground plates 4 and 5 in order to prevent interference between the two high-frequency circuits 2 and 3. The plated through holes will be referred to as through holes in the following discussion.

The first through holes 6 and the ground plates 4, 5 constitute a waveguide which prevents interference with signals from the outside of the high-frequency circuit apparatus. The second through holes 7, those of the first through holes 6 that are located on the lines along which the second through holes 7 are arrayed in the second direction, as indicated by 6-a and 6-b, and the ground plates 4 and 5 constitute a waveguide resonator whose resonance frequency is identical to an intermediate frequency between the respective signal frequency bands of the high-frequency circuits 2 and 3 and which prevents signals belonging to the respective frequency bands of the high-frequency circuits 2 and 3 from passing therethrough.

The two rows of the first through holes 6 are spaced from one another at a predetermined first distance W and the two columns of the second through holes 7 are spaced from one another at a predetermined second distance L. The resonance frequency of the waveguide resonator is determined in accordance with the first and second distances W and L. The waveguide resonator has frequency characteristics which are determined in accordance with the number and diameter of the second through holes 7.

The transmitter 2 and the receiver 3 as the high-frequency circuits mounted on the printed circuit board 1 are provided with various electronic elements and are shielded by the metal casings, as in the prior art. Input and output terminals of the transmitter 2 and the receiver 3 are connected to other circuits through connectors (not shown) provided on the printed circuit board 1. Also, the printed circuit board 1 may be provided therein with multiple wiring layers corresponding to the transmitter 2 and the receiver 3.

Generally speaking, the lower ground plate 4 of the printed circuit board 1 is formed on the entire lower surface of the printed circuit board and the upper ground plate 5 is formed in a vacant space on the surface portion of the upper surface of the printed circuit board on which no electronic elements are mounted. The metal casings of the transmitter 2 and the receiver 3 are connected to the ground plates 4 and 5 and isolated from other conductor pattern.

The through holes 6 extend through the printed circuit board 1 from the upper surface to the lower surface thereof and are spaced at a relatively small distance. The upper and lower ground plates 4 and 5 are connected by the plating metal formed on the inner peripheral surfaces of the through holes 6. Thus, the two rows of the through holes 6 constitute a waveguide whose width is W. The through holes 6 correspond to the E-plane of the waveguide and the H-plane is defined by the upper and lower ground plates 4 and 5 of the printed circuit board 1. The plural second through holes 7 which are spaced at the distance L serve as a susceptance and correspond, in this sense, to a post of a waveguide filter.

Although two columns of the through holes 7 which are laterally spaced are provided in the arrangement shown in FIGS. 1A and 1B, the number of the columns is not limited to two and can be three or four.

Although the diameter of each of the through holes 7 is greater than the diameter of each of the through holes 6 in the illustrated embodiment, it is possible to increase the number of the through holes 7 in order to make the diameter of each through hole 7 identical to the diameter of each of the first through holes 6. In this alternative, the production process can be advantageously simplified.

The larger the diameter of each through hole 7, the narrower the signal passband. Also, the passband is smaller when the posts of the through holes 7 are located between the opposed through holes 6 than when the through holes 7 are located close to the through holes 6.

The relationship between the diameter of the through holes and the susceptance formed thereby can be experimentally obtained by a simulation test using a hollow waveguide.

Figure 2:
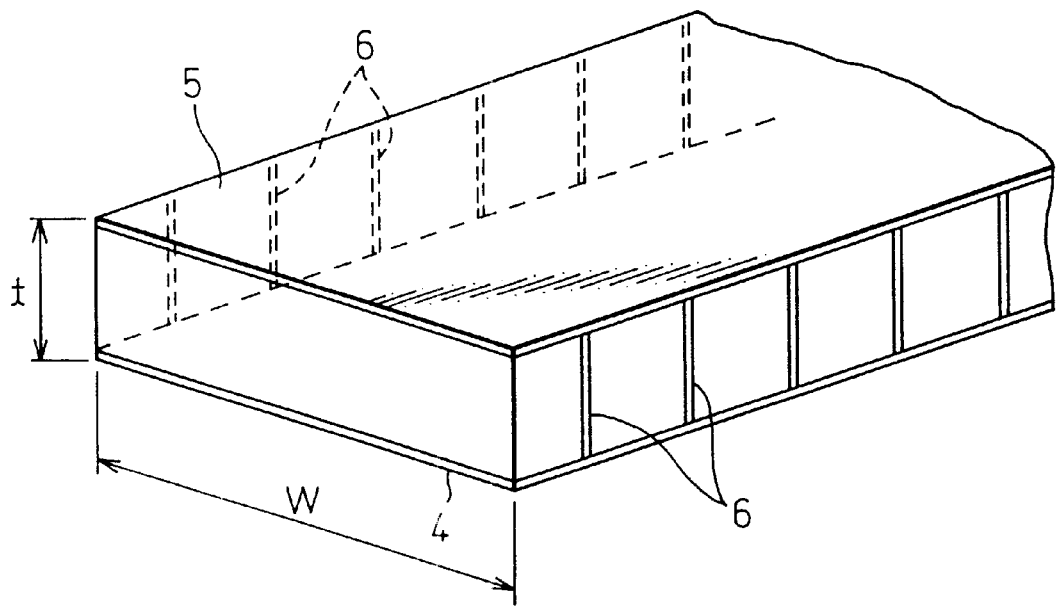
FIG. 2 is a perspective view of the high-frequency circuit apparatus shown in FIG. 1A.

FIG. 2 schematically shows a perspective view of the waveguide formed by the ground plates 4, 5 and the through holes 6 in a high-frequency circuit apparatus shown in FIGS. 1A and 1B. Assuming that the thickness of the printed circuit board 1 is "t", the distance between the opposed through holes 6 is "W", a waveguide of width "W" and thickness "t", which is filled with dielectric material (insulating plate) forming the printed circuit board is obtained. Namely, in general, at a $TE_{10}$ mode, the high-frequency current flows in the upward and downward direction of the E-plane but does not flow in the lateral direction thereof. Consequently, the high-frequency current passes through the through holes 6 corresponding to the E-plane, and hence the ground plates 4, 5 and the through holes 6 serve as a waveguide. In this case, the portions between the adjacent through holes 6 are equivalent to slits at the E-plane of the rectangular waveguide. Therefore, the smaller the distance between the adjacent through holes 6, the smaller the loss as a waveguide. The width W of the waveguide corresponds to the length of the transmitter 2 or the receiver 3, and is usually 10 and several cm or larger.

In general, the width W of the waveguide is preferably up to approximately 1.8 times the wavelength of the signal passing through the waveguide. In an example, in case of a CDMA base station for a PCS (Personal Communication System) using a frequency of 2 GHz;

f=2 GHz $\lambda = c/f = 300/2 = 150$ mm wherein "c" represents the speed of light.
When W=180 mm, we obtain $$\lambda_g = \lambda/\sqrt{1-(\lambda/W)^2} = 150/\sqrt{1-(150/180)^2} = 271 \text{ mm}$$

wherein $\lambda_g$ represents the internal wavelength of the waveguide. Therefor, the ratio of the wavelength $\lambda_g$ and the width W is given by $$\lambda_{g/w} = 271/180 = 1.8$$

Thus, as mentioned above, a frequency up to the frequency corresponding to the internal wavelength identical to 1.8 times the width W of the waveguide can be used.

Assuming that the dielectric constant $\epsilon r$ of the printed circuit board 1 is equal to 4 ($\epsilon r=4$), the width W' of the waveguide is;

$$W' = W/\sqrt{\epsilon r} = 90 \text{ mm}$$

On the assumption that W'=100 mm, $\epsilon r=4$, the wavelength W in the free space is 200 mm. Since the usable wavelength is approximately 1.8 times the width W of the waveguide, as mentioned above, the wavelength corresponding to the cut-off frequency which cannot be used is approximately 2×W, at the $TE_{10}$ mode. Consequently, in this example, the frequency of 750 MHz corresponding to the wavelength of 400 mm is the cut-off frequency. Thus, if the waveguide is formed so that the attenuation of the signal power is minimum when the cutoff frequency is the resonance frequency, no interference of the transmitter 2 with the receiver 3 occurs.

The distance L between the through holes 7 will be discussed below.

To realize a $TE_{101}$ resonance at W=180 mm and the used frequency=2 GHz, the following known formula for the resonance frequency of a rectangular hollow resonator is used;

$$\lambda_0 = 2/\sqrt{(m/a)^2 + (n/b)^2 + (s/1)^2}$$

wherein TEmns; m=1, n=0, s =1
a=W, l=1
Therefore, L=82.5 mm
Taking into account the dielectric constant, we obtain L'=L/2=41 mm.

As can be seen from the above discussion, the resonance frequency of the waveguide resonator can be determined in connection with the distance L between the through holes 7 and the width W of the waveguide. For instance, if the inner-tube wavelength of the waveguide is $\lambda_g$, a band-pass waveguide filter whose central frequency is the resonance frequency can be formed when the value of $\lambda_g/2$ is nearly equal to the distance L between the through holes 7.

Figure 3:
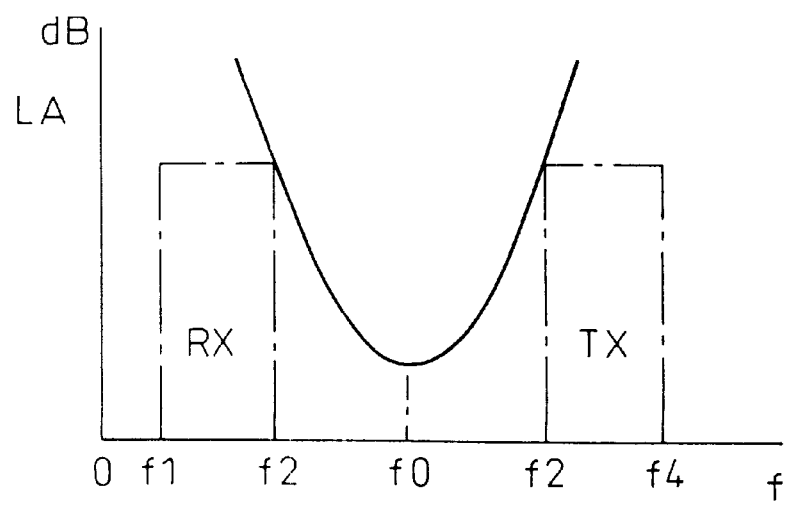
FIG. 3 is a graph showing frequency characteristics versus resonance frequencies in the high-frequency circuit apparatus shown in FIG. 2.

FIGS. 3 is a graph which schematically shows frequency characteristics of the waveguide resonator shown in FIGS. 1A, 1B and 2, by way of example.

In FIG. 3, the abscissa represents the frequency and the ordinate represents the attenuation of the signal power, respectively. The frequency band of the signals output from the transmitter (Tx)2 is in the range between frequencies f3 and f4. The frequency band of the signals received by the receiver (Rx)3 is in the range between frequencies f1 and f2. The signal bands of the transmitter 2 and the receiver 3 are indicated by dotted and dashed lines of which the vertical lines represent the signal intensity. To prevent interference between the transmitter 2 and the receiver 3, it is necessary to absorb the signals between frequencies f2 and f3. To this end, the waveguide resonator is constructed so that a signal whose frequency is greater than frequency f2 cannot be input to the receiver 3 and the signals output from the transmitter 2, whose frequency is smaller than frequency f3 can be interrupted, as can be seen in the drawings. Namely, the resonance frequency defined by the through holes 7 as a susceptance is selected to be different from the frequency of the high-frequency signal to be attenuated between the high-frequency circuits, and the frequency of the leakage high-frequency signal is within the attenuation range of the frequency characteristics of a bandpass waveguide filter.

An increase in the diameter or the number of the through holes 7 leads to an increase in the loaded Q of the resonance circuit, thus resulting in a narrowband waveguide resonator. Here, Q=QL is represented by the width of the passband/the central frequency at QL=3 dB.

Figure 4:
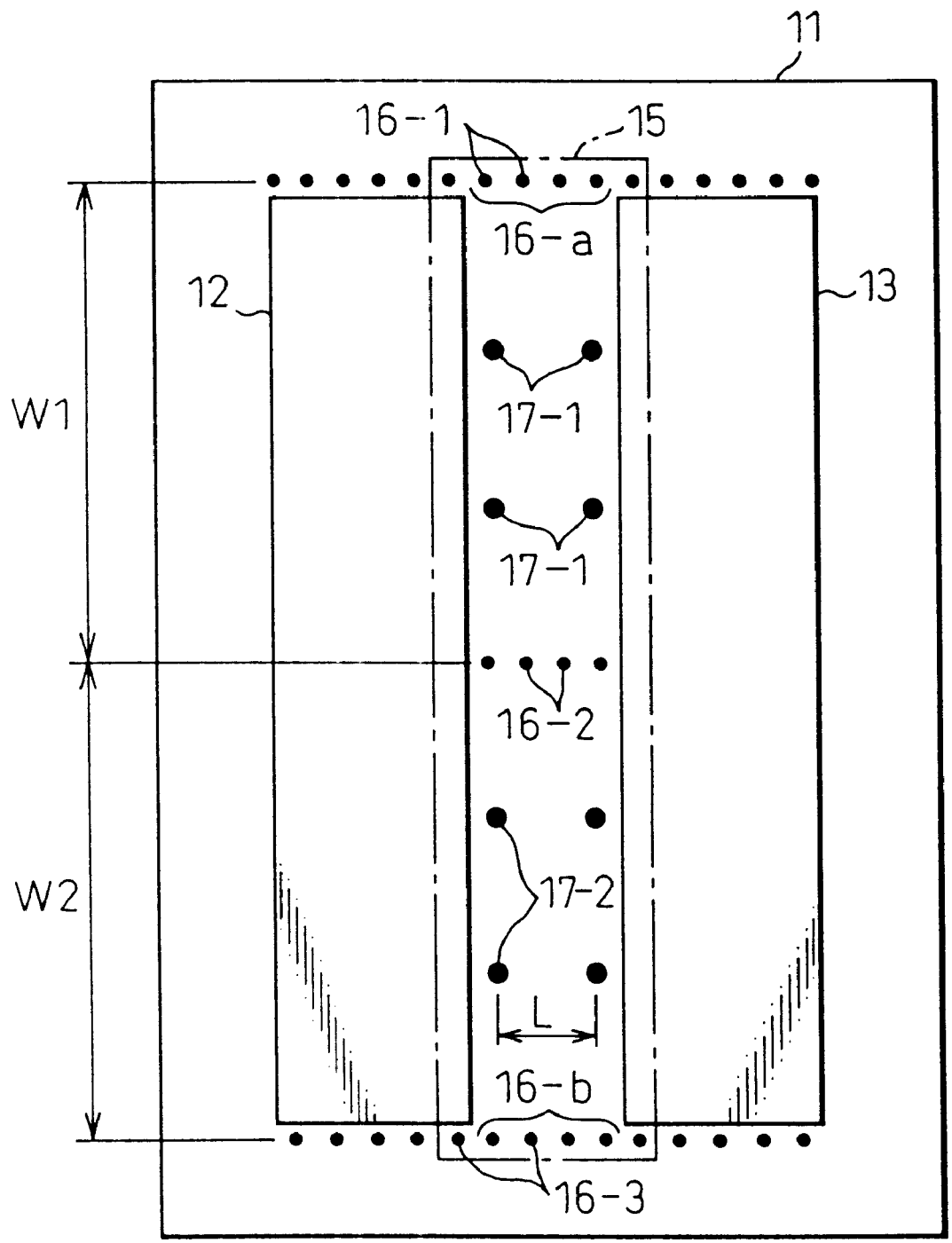
FIG. 4 is a schematic plan view of a high-frequency circuit apparatus according to a second embodiment of the present invention.

FIG. 4 schematically shows a plan view of a high-frequency circuit apparatus according to a second embodiment of the present invention. In FIG. 4, the high-frequency circuit apparatus is composed of a transmitter 12, a receiver 13, two rows of first through holes 16-1 and 16-3, at least one row of second through holes 16-2, two columns of third through holes 17-1, and two columns of fourth through holes 17-2.

The transmitter 12 and the receiver 13 form high-frequency circuits mounted on the printed circuit board.

The first through holes 16-1 and 16-3 connect the upper and lower ground plates 15 on the upper and lower surfaces of the printed circuit board 11 and are arrayed in a first direction so that the transmitter 12 and the receiver 13 are located between the first through holes 16-1 and 16-3.

The second through holes 16-2 are located between the transmitter 12 and the receiver 13 and between the first through holes 16-1 and 16-3, and connect the upper and lower grounding patterns 15 of the printed circuit board 11. The second through holes 16-2 are arrayed in parallel with the first through holes 16-1 and 16-3.

The third through holes 17-1 connect the upper and lower ground plate 15 of the printed circuit board 11 and are arrayed in a second direction different from the first direction between the transmitter 12 and the receiver 13 and between the first through holes 16-1 and the second through holes 16-2 to prevent an interference of signals between the transmitter 12 and the receiver 13.

The fourth through holes 17-2 connect the upper and lower ground plate 15 of the printed circuit board 11 and are arrayed in the second direction different from the first direction between the transmitter 12 and the receiver 13 and between the other first through holes 163 and the second through holes 16-2 to prevent an interference of signals between the transmitter 12 and the receiver 13.

One of the first through holes 16-1 and 16-3, i.e., the first through holes 16-1, the second through holes 16-2 and the ground plates 15 constitute a first waveguide which prevents an interference with the outside of the high-frequency circuit apparatus.

Likewise, the other first through holes 16-3, the second through holes 16-2 and the ground plates 15 constitute a second waveguide, parallel with the first waveguide, which prevents interference with the outside of the high-frequency circuit apparatus.

The third through holes 17-1 and those of the first through holes 16-1 that are located on an extension of the third through holes 17-1 in the second direction, i.e., the first through holes 16a, constitute a first waveguide resonator whose resonance frequency is identical to an intermediate frequency between the respective signal frequency bands of the transmitter 12 and the receiver 13 and which prevents signals belonging to the respective frequency bands of the transmitter 12 and the receiver 13 from passing therethrough. Likewise, the fourth through holes 17-2 and those of the other first through holes 16-3 that are located on an extension of the fourth through holes 17-2 in the second direction i.e., the first through holes 16b, constitute a second waveguide resonator whose resonance frequency is identical to an intermediate frequency between the respective signal frequency bands of the transmitter 12 and the receiver 13 and which prevents signals belonging to the respective frequency bands of the transmitter 12 and the receiver 13 from passing therethrough.

One row of the first through holes 16-1 and 16-3, i.e. the first through holes 16-1 and the second through holes 16-2 are spaced from one another at a predetermined first distance W1 on the printed circuit board 11.

The other first through holes 16-3 and the second through holes 16-2 are spaced from one another at a predetermined second distance W2 on the printed circuit board 11.

Two columns of the third through holes 17-1 and two columns of the fourth through holes 17-2 are respectively spaced from one another at a predetermined third distance L in the second direction.

The resonance frequency of the first waveguide resonator is determined in accordance with the first distance W1 and the third distance L.

The resonance frequency of the second waveguide resonator is determined in accordance with the second distance W2 and the third distance L.

The first and second waveguide resonators have frequency characteristics which are determined in accordance with the number and diameter of the third and fourth through holes 17-1 and 17-2.

Namely, in the second embodiment, if the distance between the opposed first through holes 16-1 and 16-3 is large, the arrangement is divided into two parallel waveguides. The bandpass waveguide filter of width W1, consisting of the through holes 16-1, 16-2 and the through holes 17-1 which form the susceptance, and the bandpass waveguide filter of width W2, consisting of the through holes 16-2, 16-3 and the through holes 17-2 which form the susceptance are provided in parallel. Consequently, desired resonance frequencies f0, i.e., frequencies deviated from those of the leakage frequency signals to be attenuated between the transmitter 12 and the receiver 13 can be obtained by the respective bandpass waveguide filters.

In the embodiment illustrated in FIG. 1A, there is a possibility that the resonance frequency of the waveguide resonator deviates from a desired value due to the irregularities in the distance L between the through holes 7, the width W, the diameter of each through hole 7, the dielectric constant of the dielectric which constitutes the printed circuit board 1, and the distance between the through holes 6, etc. The same is true in the embodiment illustrated in FIG. 3. To compensate for the deviation, a variable capacitance diode is provided in a third embodiment of the present invention.

Figure 5A:
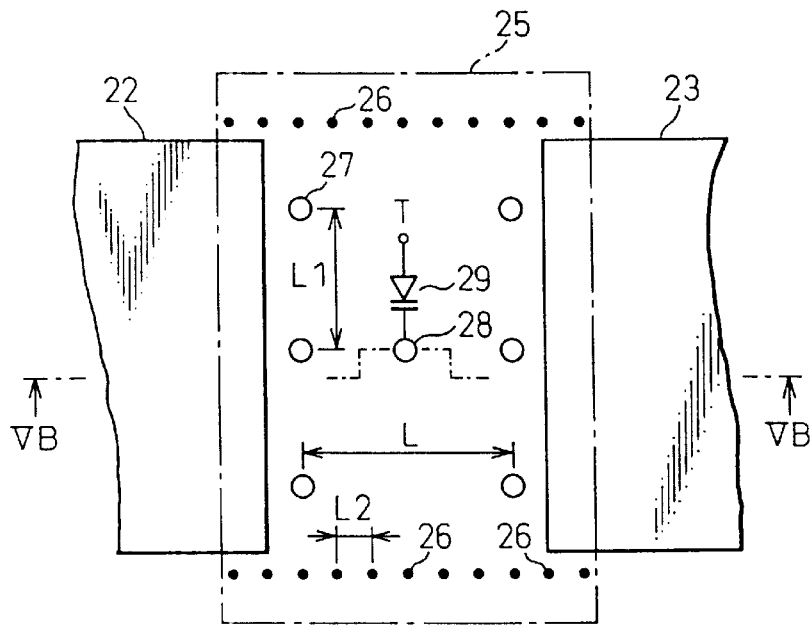
FIG. 5A is a schematic plan view of a high-frequency circuit apparatus according to a third embodiment of the present invention.
Figure 5B:
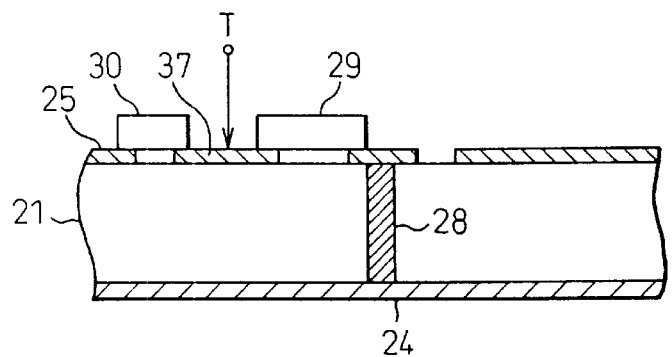
FIG. 5B is a sectional view taken along the line VB—VB in FIG. 5A.

FIG. 5A schematically shows a plan view of a high-frequency circuit apparatus according to the third embodiment of the present invention and FIG. 5B shows a sectional view taken along the line VB—VB in FIG. 5A.

In FIGS. 5A and 5B, 21 designates the printed circuit board, 22 the transmitter, 23 the receiver, 24 and 25 the ground plates, 26 and 27 the through holes, respectively. These elements correspond to the printed circuit board 1, the transmitter 2, the receiver 3, the ground plates 4 and 5, and the through holes 6 and 7 in FIG. 1A, respectively.

In the illustrated embodiment, a through hole 28, a variable capacitance diode 29 and a direct current cutting capacitor 30 are provided.

The variable capacitance diode 29 is connected between the through hole 28 and the terminal T at or near a point of the maximum electric field (usually, center of the resonator) at $TE_{10}$ mode. The DC cutting capacitor 30 is connected to the terminal T and the ground plate 25.

Figure 6:
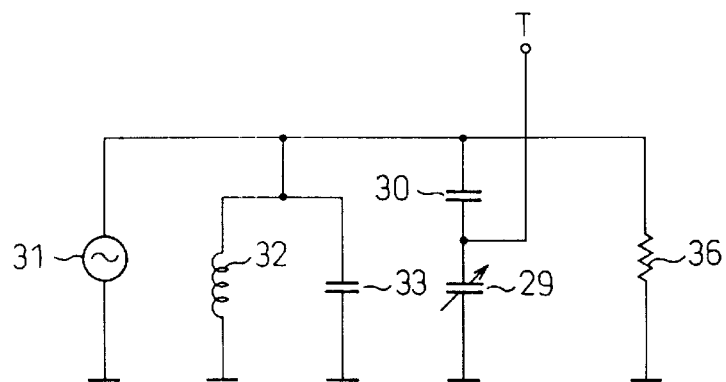
FIG. 6 is an equivalent circuit diagram of a high-frequency circuit apparatus shown in FIG. 5A.

FIG. 6 shows an equivalent circuit diagram of the high-frequency circuit apparatus according to the third embodiment of the present invention shown in FIGS. 5A and 5B. In FIG. 6, 31 designates the signal source of the leakage high-frequency signals or the like, such as the transmitter, 32 the equivalent inductance of the waveguide resonator, 33 the equivalent capacitance of the waveguide resonator, 30 the DC cutting capacitor, 29 the variable capacitance diode, 36 the load on the leakage high-frequency signal in the receiver or the like, and T the biasing terminal, respectively.

In operation, when the bias voltage is applied through the terminal T, the current path between the ground plate 25 and the terminal T is electrically cut by the DC cutting capacitor 30, so that the voltage from the terminal T is applied to the variable capacitance diode 29. The capacitance of the variable capacitance diode 29 is adjusted by varying the applied voltage. Consequently, the resonance frequency of the waveguide resonator composed of the equivalent inductance 32 and the equivalent capacitance diode 33 is adjusted. Thus, the deviation of the resonance frequency due to the irregularity in the dimension of each element can be corrected. This is useful not only to compensate for the dimensional error but also to readjust the frequency for the high-frequency circuits of the transmitter and the receiver when modified, so that the modified frequency is a resonance frequency deviated from the frequency of the leakage high-frequency signal to be attenuated.

It is also possible to carry out a fine adjustment of the resonance frequency of the waveguide resonator by disposing the through hole connected in series with the variable capacitance diode 29 away from the maximum point of the electric field.

Moreover, it is possible to provide and connect, in place of the variable capacitance diode 29 shown in FIG. 5B, a chip capacitor whose capacitance is the same as the capacitance obtained when the variable capacitance diode 29 is adjusted so as to obtain a desired resonance frequency, between and to the terminal T and the through hole 28.

Figure 7:
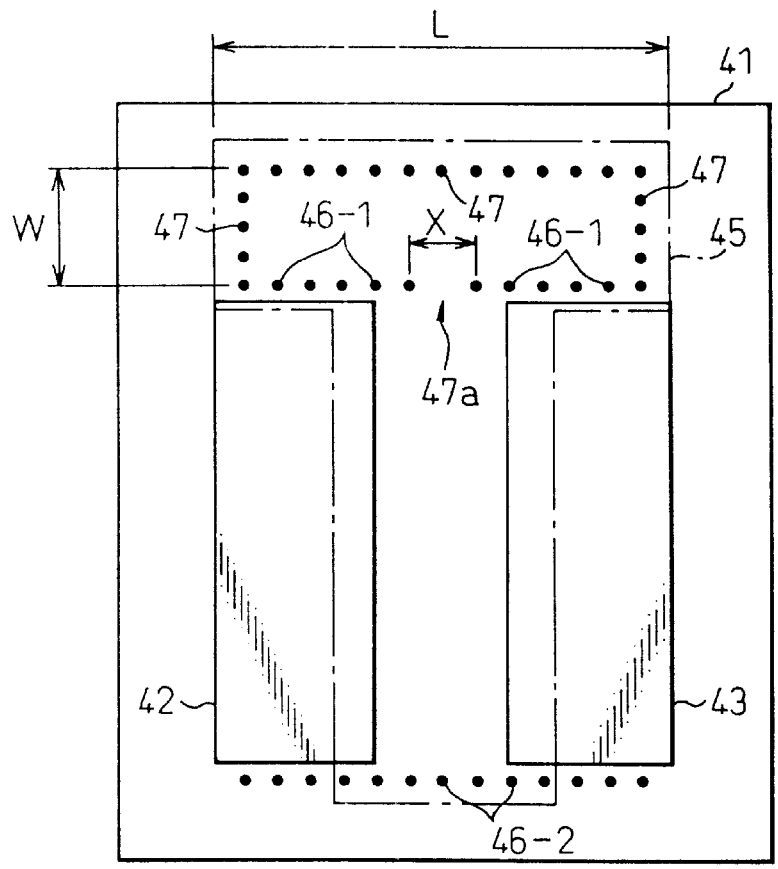
FIG. 7 is a schematic plan view of a high-frequency circuit apparatus according to a fourth embodiment of the present invention.

FIG. 7 schematically shows a plan view of a high-frequency circuit apparatus according to a fourth embodiment of the present invention. In FIG. 7, 41 designates the printed circuit board, 42 the transmitter, 43 the receiver, 45 the ground plate on the upper surface, 46-1 and 46-2 the first through holes, respectively. These elements correspond to the printed circuit board 1, the transmitter 2, the receiver 3, the ground plate 5, and the through holes 6 in FIG. 1A, respectively, The ground plate 44 on the lower surface is not shown.

In this embodiment, the second through holes 47 which connect the upper and lower ground plates or layers 44 and 45 of the printed circuit board 41 are arranged to form a rectangle, of which one side close to the transmitter 42 and the receiver 43 is defined by one of the first through holes 46-1 and 46-2, i.e., the first through holes 46-1. A coupling window 47a is formed in the row of the first through holes 46-1. The width of the coupling window 47a is greater than the distance between those of the first through holes 46-1 that are located on opposite sides of the high-frequency circuits.

Two rows of the first through holes 46-1 and 46-2 and the ground plates (layers) 44 and 45 constitute a waveguide which prevents interference with signals from the outside of the high-frequency circuit apparatus.

The second through holes 47, one of the first through holes 46-1 and 46-2, i.e., the first through holes 46-1, and the ground plates 44 and 45 constitute a waveguide resonator whose resonance frequency is an intermediate frequency between the signal frequency bands of the transmitter 42 and the receiver 43 and which does not permit the signals of the frequency bands of the transmitter 42 and the receiver 43 to pass therethrough.

The rectangle defined by the first through holes 46-1 and the second through holes 47 has a predetermined first length L in the first direction and a predetermined width W in the second direction. The resonance frequency of the waveguide resonator is determined in accordance with the length L and the width W.

The waveguide resonator has frequency characteristics which are determined in accordance with the width X of the coupling window 47a.

Figure 8:
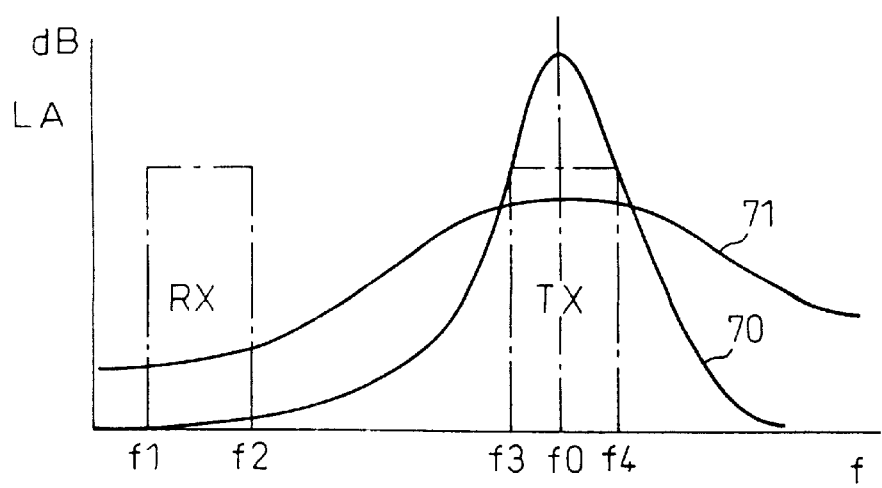
FIG. 8 is a graph showing frequency characteristics versus resonance frequencies in a high-frequency circuit apparatus shown in FIG. 7.

FIG. 8 shows a graph representing the frequency characteristics of the high-frequency circuit apparatus shown in FIG. 7. In FIG. 8, the abscissa represents the frequency and the ordinate represents the amount of attenuation LA of the signal power. The frequency band of the signals output from the transmitter (Tx) 42 is in the range between f3 and f4 and the frequency band of the signals received by the receiver (Rx) 43 is in the range between f1 and f2. The frequency bands of the transmitter 42 and the receiver 43 are indicated by dotted and dashed lines of which the ordinate represents the signal intensity. In this embodiment, the values of L and W are selected so that the amount of attenuation by the waveguide resonator is maximum at an intermediate frequency f0 of the signal frequency band of the transmitter (Tx) 42. Consequently, the signal from the transmitter (Tx) 42 is reflected by the waveguide resonator toward the transmitter (Tx) 42 and hence no signal reaches the receiver (Rx) 43. If the width X of the window 47a is small, the frequency characteristic curve is relatively steep, as indicated by 70, and conversely if the width X is large, the frequency characteristic curve is not sharp, as indicated by 71.

Thus, in the embodiment illustrated in FIG. 7, the waveguide resonator constituted by the second through holes 47, the first through holes 46-1, and the ground plates 44 and 45 forms a band-elimination waveguide filter (BEF). Consequently, it is possible to prevent the high-frequency signal output from the transmitter 42 from leaking through the printed circuit board 41 and reaching the receiver 43.

Figure 9A:
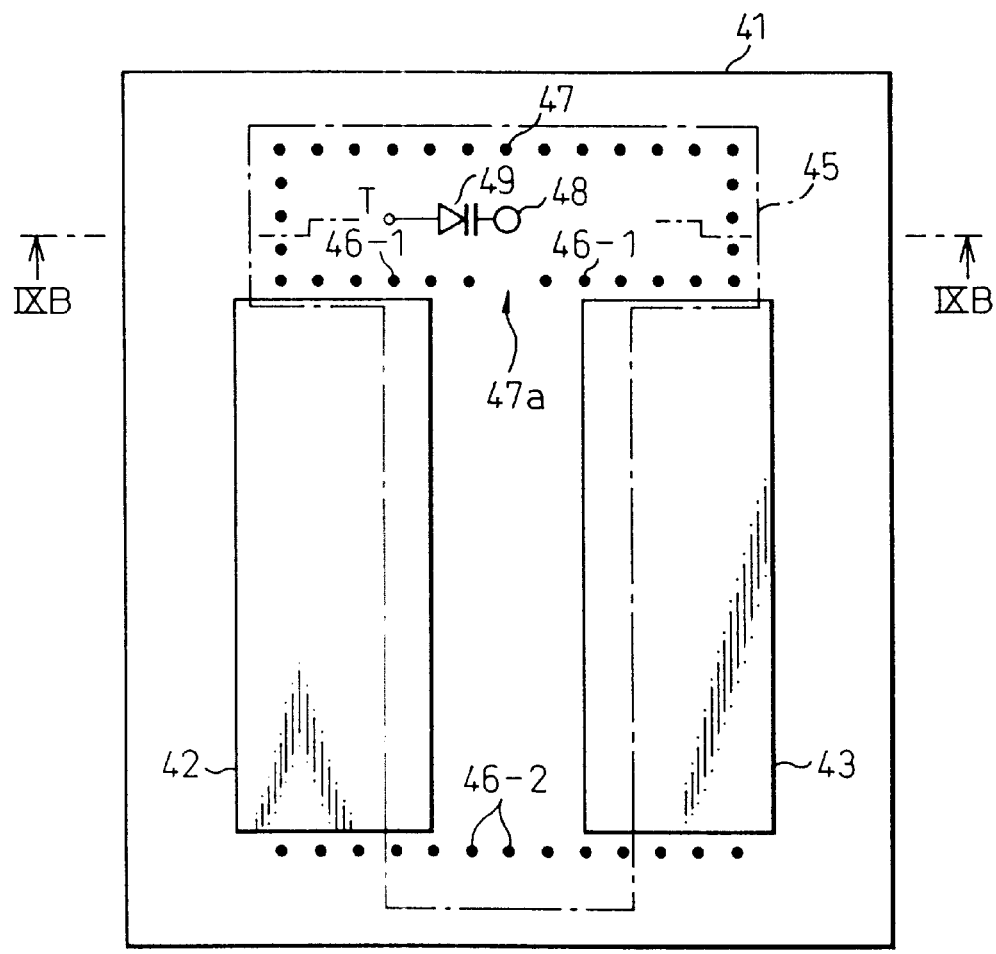
FIG. 9A is a schematic plan view of a high-frequency circuit apparatus according to a fifth embodiment of the present invention.
Figure 9B:
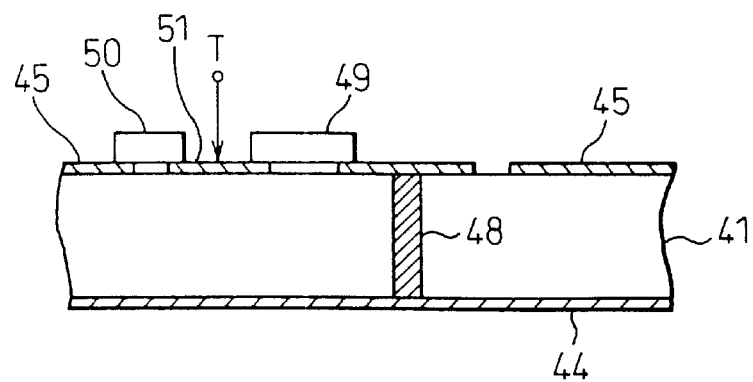
FIG. 9B is a sectional view taken along the line IXB—IXB in FIG. 9A.

FIG. 9A schematically shows a plan view of a fifth embodiment of a high-frequency circuit apparatus according to the present invention, and FIG. 9B shows a sectional view taken along the line XB–IXB in FIG. 9A.

In FIGS. 9A and 9B, the elements corresponding to those in FIG. 7 are designated with like reference numbers.

In the fifth embodiment, a through hole 48, a variable capacitance diode 49, and a direct current cutting capacitor 50 are provided.

The variable capacitance diode 49 is connected to the through hole 48 and the terminal T in the vicinity of a point at which the electric field at $TE_{10}$ mode is maximum, i.e., in the vicinity of the center of the waveguide resonator which is constituted by the second through holes 47, one of the first through holes, i.e., the first through holes 46-1, and the ground plates 44, 45. The DC cutting capacitor 50 is connected to the terminal T and the ground plate 45.

Figure 10:
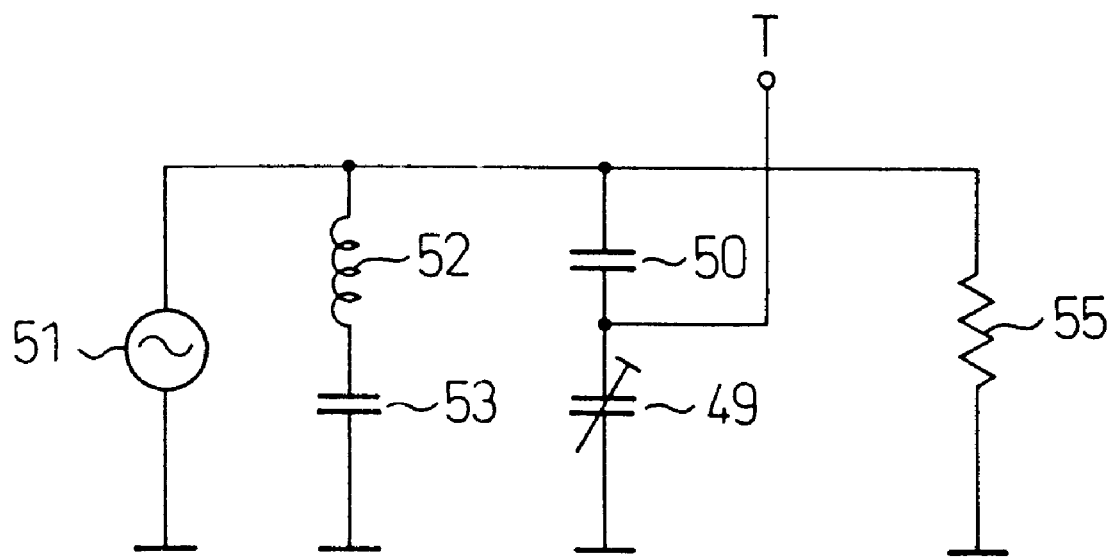
FIG. 10 is an equivalent circuit diagram of a high-frequency circuit apparatus shown in FIGS. 9A and 9B.

FIG. 10 shows an equivalent circuit diagram of a fifth embodiment of a high-frequency circuit apparatus shown in FIGS. 9A and 9B. In FIG. 10, 51 designates the signal source such as the transmitter, for the leakage high-frequency signals, 52 the equivalent inductance of the waveguide resonator, 53 the equivalent capacitance of the waveguide resonator, 50 the DC cutting capacitor, 49 the variable capacitance diode, 52 the load on the leakage high-frequency signal, such as the receiver, and T the biasing terminal, respectively.

In operation, when the biasing voltage is applied from the terminal T, the terminal T is electrically disconnected from the ground plate 45 by the DC cutting capacitor 50, so that the voltage from the terminal T is applied to the variable capacitance diode 49. The capacitance of the variable capacitance diode 49 is controlled by varying the applied voltage. Thus, the resonance frequency of the waveguide resonator which is constituted by the equivalent inductance 52 and the equivalent capacitance 53 is controlled. Consequently, a deviation of the resonance frequency due to an irregularity in the dimension of the components of the waveguide resonator or in the dielectric constant of the printed circuit board can be corrected. Moreover, it is also possible to apply the present invention to readjustment of the resonance frequency so that the resonance frequency is different from the frequency of the leakage high-frequency signal to be attenuated if the frequencies processed by the high-frequency circuits of the transmitter and the receiver are modified.

In addition to the foregoing, if the through hole which is connected in series to the variable capacitance diode 49 is disposed far away from the maximum electric field point, a fine adjustment of the resonance frequency of the waveguide resonator can be made.

It is also possible to connect a chip capacitor whose capacitance is identical to the capacitance obtained when the variable capacitance diode 49 is adjusted to obtain a desired resonance frequency, to the terminal T and the through hole 48, in place of the variable capacitance diode 49 shown in FIGS. 9A and 9B. In this alternative, the capacitance of the chip capacitor is appropriately selected to modify the resonance frequency of the waveguide resonator.

Figure 11A:
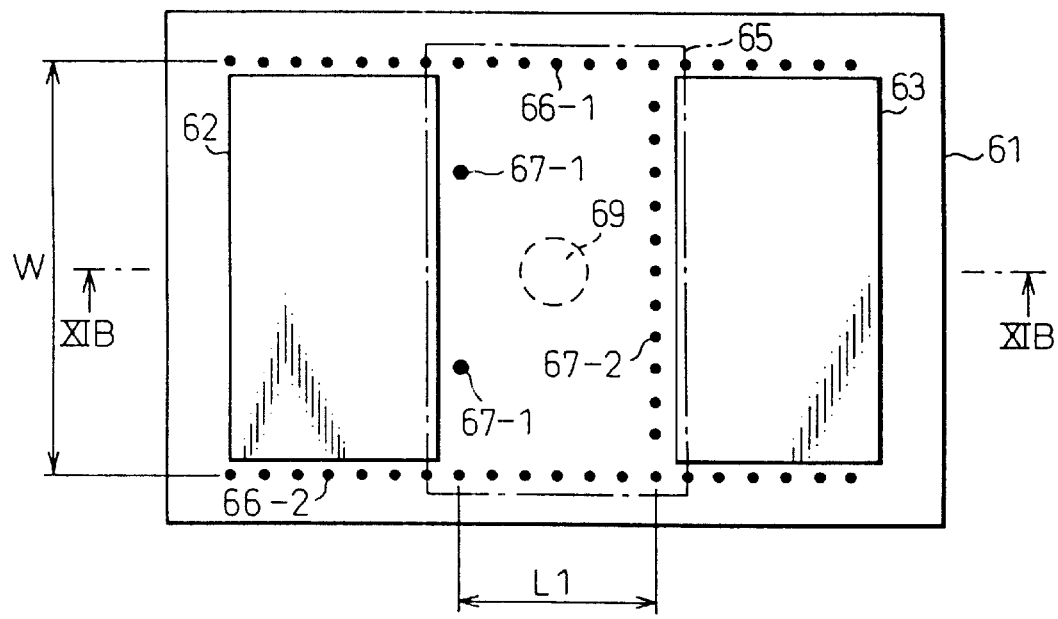
FIG. 11A is a schematic plan view of a high-frequency circuit apparatus according to a sixth embodiment of the present invention.
Figure 11B:
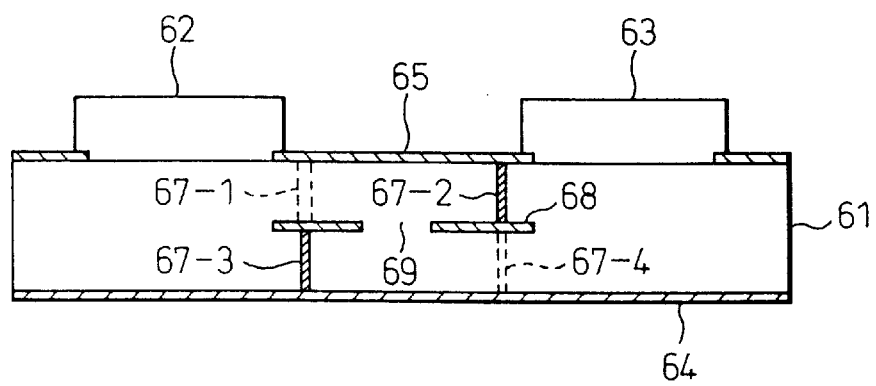
FIG. 11B is a sectional view taken along the line XIB—XIB in FIG. 11A.

FIG. 11A shows a sixth embodiment of a high-frequency circuit apparatus according to the present invention; FIG. 11B shows a sectional view taken along the line XIB—XIB in FIG. 11A; and, FIG. 11C is a back view of a high-frequency circuit apparatus shown in FIG. 11A, respectively.

In FIGS. 11A through 11C, 61 designates the printed circuit board, 62 the transmitter, 63 the receiver, 64 and 65 the ground plates, 66-1 and 66-2 the through holes, respectively. These elements correspond to the printed circuit board 1, the transmitter 2, the receiver 3, the ground plates 4 and 5, and the through holes 6 in FIG. 1A, respectively.

In this embodiment, through holes 67-1 to 67-4, an intermediate ground plate 68, and a coupling window 69 are provided.

The intermediate ground plate 68 is located between the upper and lower ground plates 65 and 64. The coupling window 69 is formed at the center of the intermediate ground plate 68. The upper through holes 67-1 nd 67-2 connect the upper ground plate 65 and the intermediate ground plate 68. The lower through holes 67-3 and 67-4 connect the lower ground plate 64 and the intermediate ground plate 65. The through holes 66-1, 66-2, the upper ground plate 65, the through holes 67-1, 67-2, and the intermediate ground plate 68 constitute an upper waveguide resonator. The through holes 66-1, 66-2, the lower ground plate 64, the through holes 67-3, 67-4, and the intermediate ground plate 68 constitute a lower waveguide resonator.

The through holes 66-1 and 66-2 are spaced from one another at a predetermined distance W and the through holes 67-1 and 67-2 are spaced from one another at a predetermined length L1. The through holes 67-3 and 67-4 are spaced from one another at a predetermined length L2.

The lengths L1 and L2 can be identical or different, depending on the resonance frequencies of the upper and lower waveguide resonators. The resonance frequencies of the upper and lower waveguide resonators are determined in accordance with the width W and the lengths L (L1, L2). The frequency characteristics of the upper waveguide resonator is determined in accordance with the diameter and number of the through holes 67-1 and 67-2. Likewise, the frequency characteristics of the lower waveguide resonator is determined in accordance with the diameter and number of the through holes 67-3 and 67-4. The transmitter 62 and the upper waveguide resonator are electromagnetically coupled via the through holes 67-1. The magnetic field at the through holes 67-1 is maximum. The through holes 67-2 reflect an electromagnetic wave between the receiver 63 and the upper waveguide resonator to thereby prevent an electromagnetic coupling therebetween. Likewise, the through holes 67-3 reflect an electromagnetic wave between the transmitter 62 and the lower waveguide resonator to thereby prevent an electromagnetic coupling therebetween. The receiver 63 and the lower waveguide resonator are electromagnetically coupled via the through holes 67-4. The magnetic field at the through holes 67-4 is maximum.

The coupling window 69 establishes an electromagnetic coupling between the upper waveguide resonator and the lower waveguide resonator. The electric field at the coupling window 69 is maximum. In the illustrated embodiment, the number of the through holes 67-1 is less than the number of the through holes 67-2, so that the upper waveguide resonator is not coupled to the transmitter 62 and is coupled to the receiver 63. Moreover, the number of the through holes 67-4 is less than the number of the through holes 67-3, so that the lower waveguide resonator is not coupled to the transmitter 62 but is coupled to the receiver 63. The smaller the size of the coupling window 69, the sharper the frequency characteristic curve.

In operation, the signal output from the transmitter 62 is reflected by the upper waveguide resonator and is returned to the transmitter 62. Other signals are transmitted to the lower waveguide resonator through the coupling window 69 and are transmitted from the lower waveguide resonator to the receiver 63 through the through holes 67-4.

Figure 12A:
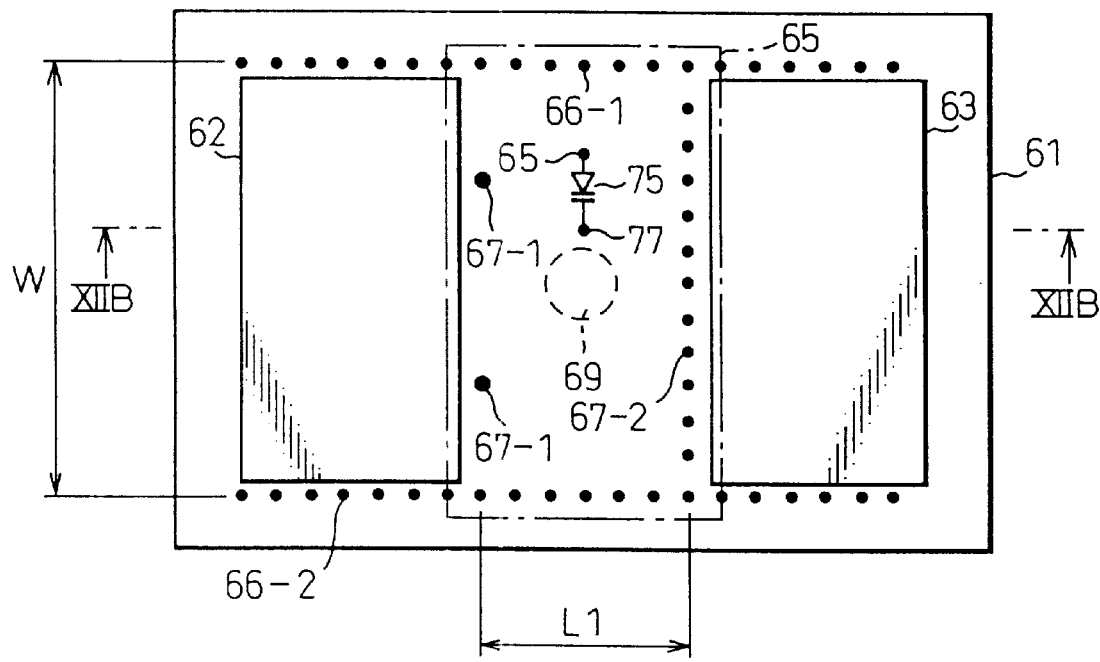
FIG. 12A is a schematic plan view of a high-frequency circuit apparatus according to a seventh embodiment of the present invention.
Figure 12B:
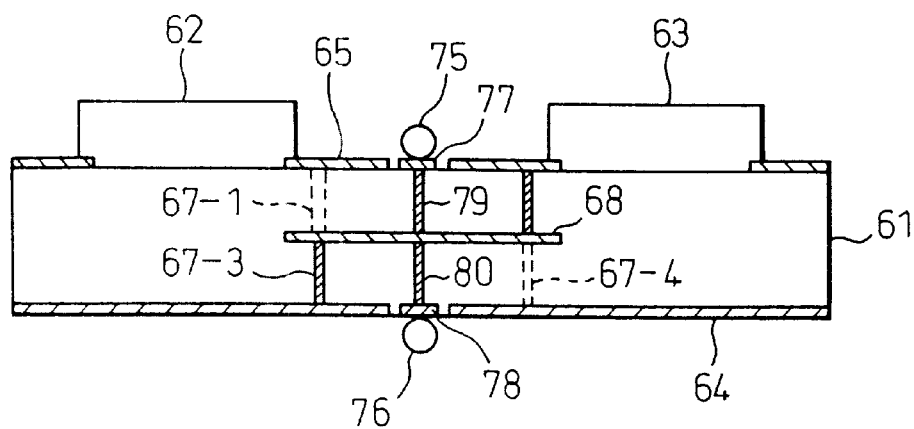
FIG. 12B is a sectional view taken along the line XIIB—XIIB in FIG. 12A.

FIG. 12A shows a plan view of a seventh embodiment of a high-frequency circuit apparatus according to the present invention; FIG. 12B schematically shows a sectional view taken along line XIIB—XIIB in FIG. 12A; and, FIG. 12C schematically shows a bottom view of a high-frequency circuit apparatus shown in FIG. 12A, respectively.

Figure 12C:
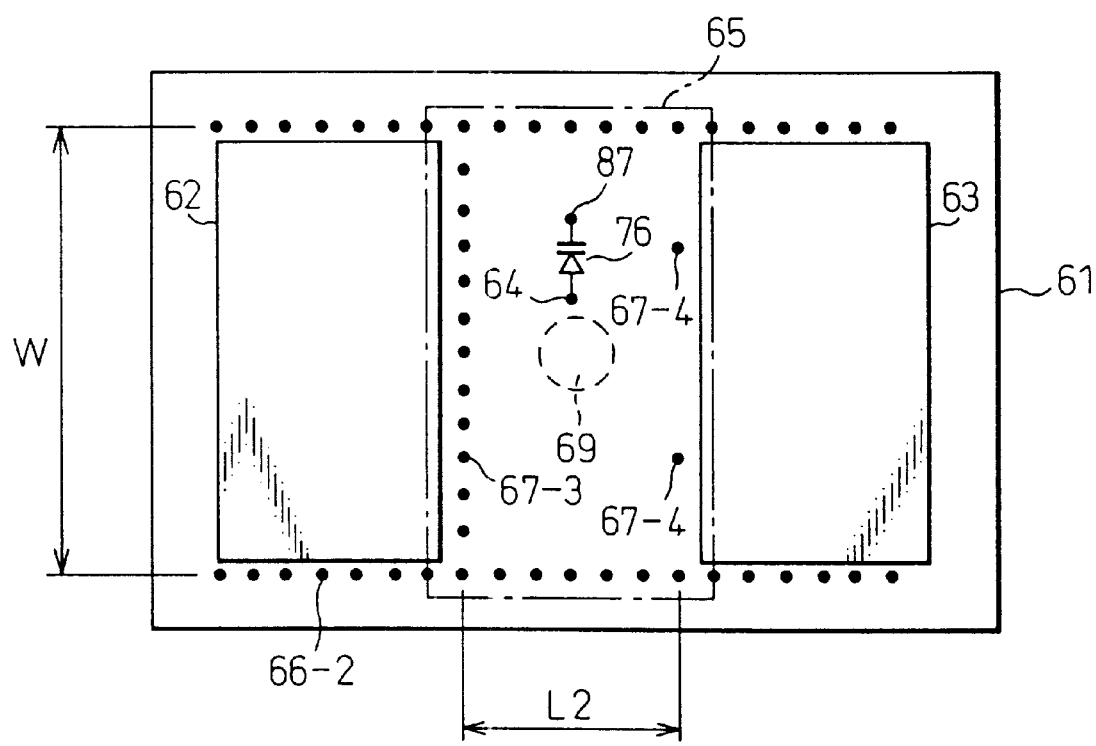
FIG. 12C is a rear view of a high-frequency circuit apparatus shown in FIG. 12B.

In FIGS. 12A through 12C, the elements corresponding to those in FIGS. 11A through 11C are designated with like reference numbers.

In the seventh embodiment, a first conductor pattern 77 which is electrically isolated from the upper ground plate 65 and a first variable capacitance diode 75 whose capacitance is varied by the bias voltage applied to the first conductor pattern 77 and which is connected to the first conductor pattern 77 and the upper ground plate 65 are provided on the upper surface of the printed circuit board. Also, a second conductor pattern 78 which is electrically isolated from the lower ground plate 64 and a second variable capacitance diode 76 whose capacitance is varied by the bias voltage applied to the second conductor pattern 78 and which is connected to the second conductor pattern 78 and the lower ground plate 64 are provided on the lower surface of the printed circuit board. The first and second conductor patterns 77 and 78 are connected by the through hole 79.

It is possible to provide only one of the first and second variable capacitance diodes 79 and 89.

Consequently, a fine adjustment of the fluctuation of the resonance frequency due to the irregularity of the components can be carried out.

In the seventh embodiment, it is possible to use the DC cutting capacitor shown in FIGS. 5A and 5B.

As can be understood from the above discussion, according to the present invention, the leakage high-frequency signals between the high-frequency circuits mounted on the printed circuit board can be attenuated by selecting the resonance frequency of the waveguide formed by the through holes arrayed on the printed circuit board.

In the case that the waveguide resonator is constituted by a band-pass waveguide filter, the frequency of the high-frequency signal to be attenuated is selected to be deviated from the central frequency of the band-pass waveguide filter. In the case that the waveguide resonator is constituted by a band-elimination waveguide filter, the frequency of the high-frequency signal to be attenuated is selected to be identical to the resonance frequency of the band-elimination waveguide filter. Consequently, the leakage high-frequency signals from the high-frequency circuits are attenuated to thereby prevent the coupling of the high-frequency circuits. Therefore, the high-frequency circuits such as the transmitter and the receiver can be mounted close to each other on the printed circuit board, thus resulting in a miniaturization of the high-frequency circuit apparatus.

Furthermore, if a variable capacitance diode for adjusting the resonance frequency is used in the band-pass waveguide filter or the band-elimination waveguide filter, the dimensional irregularity of the components of the high-frequency circuit apparatus can be compensated for and, hence, the shift operation of the resonance frequency can be easily carried out.

What is claimed is:

1. A high-frequency circuit apparatus comprising:

two high-frequency circuits (2,3) mounted on a printed circuit board (1);

two rows of first plated through holes (6) which connect upper and lower ground plates (4, 5) on upper and lower surfaces of the printed circuit board (1) and which are arrayed in a first direction so that the two high-frequency circuits (2, 3) are disposed between the first plated through holes; and, at least two columns of second plated through holes (7) which are arrayed in a second direction different from the first direction between the two high-frequency circuits to connect the ground plates on the upper and lower surfaces of the printed circuit board, wherein the rows of the first plated through holes (6) and the ground plates (4, 5) constitute a waveguide which prevents interference with a signal external to the high-frequency circuit apparatus;

the second plated through holes (7), those of the first plated through holes that are located on an extension of the second plated through holes in the second direction, and the ground plates (4, 5) constitute a waveguide resonator whose resonance frequency is identical to an intermediate frequency of signal frequency bands of the two high-frequency circuits (2, 3) and which prevents signals in the signal frequency bands of the high-frequency circuits (2, 3) from passing therethrough.

2. A high-frequency circuit apparatus according to claim 1, wherein
the two rows of the first plated through holes (6) are spaced at a first distance (W);
the columns of the second plated through holes (7) are spaced at a second distance (L);
the resonance frequency of the waveguide resonator is determined in accordance with the first and second distances;
the waveguide resonator has frequency characteristics which are determined in accordance with a number and a diameter of the second plated through holes.

3. A high-frequency circuit apparatus according to claim 1, further comprising
a third plated through hole (28) which connects the ground plates on the upper and lower surfaces of the printed circuit board in the vicinity of a point between the two high-frequency circuits at which an intensity of an electric field is maximum;
a conductor pattern (37) on the upper surface of the printed circuit board, which is electrically isolated from the ground plate (5); and,
a variable capacitance diode which is connected to the third plated through hole and the conductor pattern (37) and whose capacitance is varied in accordance with a bias voltage applied to the conductor pattern.

4. A high-frequency circuit apparatus comprising;
two high-frequency circuits (12, 13) mounted on a printed circuit board (11);
two rows of first plated through holes (16-1, 16-3) which connect upper and lower ground plates (14, 15) on upper and lower surfaces of the printed circuit-board (11) and which are arrayed in a first direction so that the two high-frequency circuits (2, 3) are disposed between the first plated through holes;
at least one row of second plated through holes (16-2) which are arrayed in parallel with the first plated through holes between the two high-frequency circuits (12, 13) to connect the ground plates (14, 15) on the upper and lower surfaces of the printed circuit board (11);
two columns of third plated through holes (17-1) which connect the ground plates (14, 15) on the upper and lower surfaces of the printed circuit board (11) and which are arrayed in a second direction different from the first direction, between the two high-frequency circuits and between one (16-1) of the two rows of the first plated through holes and the second plated through holes (16-2) to prevent a signal interference between the two high-frequency circuits (12, 13); and,
fourth plated through holes (17-2) which connect the ground plates (14, 15) on the upper and lower surfaces of the printed circuit board (11) and which are arrayed in the second direction different from the first direction, between the two high-frequency circuits and between the two other rows (16-3) of the first plated through holes and the second plated through holes (16-2) to prevent a signal interference between the two high-frequency circuits (12, 13).

5. A high-frequency circuit apparatus according to claim 5, wherein one (16-1) of the two rows of the first plated through holes (16-1, 16-3), and the second plated through holes (16-2), and the ground plates (4, 5) constitute a first waveguide which prevents an interference with an external signal of the high-frequency circuit apparatus; and the other row (16-3) of the first plated through holes, the second plated through holes (16-2), and the ground plates constitute a second waveguide parallel with the first waveguide, which prevents an interference with external signals of the high-frequency circuit apparatus.

6. A high-frequency circuit apparatus according to claim 5, wherein the third plated through holes (17-1) and those of one (16-1) of the two rows of the first plated through holes (16-1, 16-3) that are located on an extension of the third plated through holes in the second direction constitute a first waveguide resonator whose resonance frequency is identical to an intermediate frequency of signal frequency bands of the two high-frequency circuits (12, 13) and which prevents signals in the signal frequency bands of the high-frequency circuits (12, 13) from passing therethrough, and the fourth plated through holes (17-2) and those of the other row (16-3) of the first plated through holes that are located on an extension of the fourth plated through holes in the second direction constitute a second waveguide resonator whose resonance frequency is identical to an intermediate frequency of signal frequency bands of the two high-frequency circuits (12, 13) and which prevents signals in the signal frequency bands of the high-frequency circuits (12, 13) from passing therethrough.

7. A high-frequency circuit apparatus according to claim 5, wherein
one (16-1) of the two rows of the first plated through holes (16-1, 16-3) and the second plated through holes (16-2) are spaced at a first distance (W1) on the printed circuit board (11), so that the high-frequency circuits are located therebetween;
the other row (16-3) of the first plated through holes (16-1, 16-3) and the second plated through holes (16-2) are spaced at a second distance (W2) on the printed circuit board (11), so that the high-frequency circuits are located therebetween;
the two columns of the third plated through holes (17-1) and two columns of the fourth plated through holes (17-2) are respectively spaced at a third distance (L) in the second direction;
the resonance frequency of the first waveguide resonator is determined in accordance with the first and third distances;
the resonance frequency of the second waveguide resonator is determined in accordance with the second and third distances;
the first waveguide resonator has frequency characteristics which are determined in accordance with the number and the diameter of the third plated through holes (17-1);
the second waveguide resonator has frequency characteristics which are determined in accordance with a number and a diameter of the fourth plated through holes (17-2).

8. A high-frequency circuit apparatus according to claim 4, further comprising
a fifth plated through hole (28) which connects the ground plates (14, 15) on the upper and lower surfaces of the printed circuit board in the vicinity of a point between the high-frequency circuits at which the intensity of the electric field is maximum;
a conductor pattern (37) on the upper surface of the printed circuit board, which is electrically isolated from the ground plate (5); and, a variable capacitance diode (29) which is connected to the fifth plated through hole (28) and the conductor pattern (37) and whose capacitance is varied in accordance with a bias voltage applied to the conductor pattern.

9. A high-frequency circuit apparatus comprising;

two high-frequency circuits (42, 43) mounted on a printed circuit board (41);

two rows of first plated through holes (46-1, 46-2) which connect upper and slower ground plates (4, 5) on upper and lower surfaces of the printed circuit board (41) and which are arrayed in a first direction so that the two high-frequency circuits are disposed between the first plated through holes;

second plated through holes (47) which connect the ground plates (44, 45) on the upper and lower surfaces of the printed circuit board (41) and which are arrayed to define a rectangle of which one side is defined by one (46-1) of the two rows of the first plated through holes; and, a coupling window (47a) opposed to a space defined between the two high-frequency circuits, on one (46-1) of the rows of the first plated through holes, a width of the coupling window being greater than the distance between those of the plated through holes located on opposite sides of the high-frequency circuits.

10. A high-frequency circuit apparatus according to claim 9,(wherein the rows of the first plated through holes (46-1, 46-2) and the ground plates (44, 45) constitute a waveguide which prevents interference with a signal external to the high-frequency circuit apparatus;

the second plated through holes (47), one (46-1) of the rows of the first plated through holes, and the ground plates (44, 45) constitute a waveguide resonator whose resonance frequency is identical to an intermediate frequency of signal frequency bands of the two high-frequency circuits (42, 43) and which prevents signals in the signal frequency bands of the high-frequency circuits (42, 43) from passing therethrough.

11. A high-frequency circuit apparatus according to claim 10, wherein the rectangle has a first length (L) in the first direction and a second length (W) in the second direction;

the resonance frequency of the waveguide resonator is determined in accordance with the first and second lengths;

the waveguide resonator has frequency characteristics which are determined in accordance with the size of the coupling window (47a).

12. A high-frequency circuit apparatus according to claim 9, further comprising a third plated through hole (48) which connects the ground plates (44, 45) on the upper and lower surfaces of the printed circuit board in the vicinity of a point within a rectangle, at which the intensity of an electric field is maximum;

a conductor pattern (51) on the upper surface of the printed circuit board,-which is electrically isolated from the upper ground plate (45); and, a variable capacitance diode which is connected to the third plated through hole (48) and the conductor pattern (51) and whose capacitance is varied in accordance with a bias voltage applied to the conductor pattern.

13. A high-frequency circuit apparatus comprising;

two high-frequency circuits (62, 63) mounted on a printed circuit board (61);

an upper ground plate (65) formed on an upper surface of the printed circuit board;

a lower ground plate (64) formed on a lower surface of the printed circuit board;

two rows of first plated through holes (66-1, 66-2) which connect upper and lower ground plates (64, 65) on the upper and lower surfaces of the printed circuit board and which are arrayed in a first direction so that the two high-frequency circuits are disposed between the first plated through holes;

an intermediate ground plate (68) provided between the upper and lower ground plates and having at the center thereof a coupling window (69);

at least two columns of upper plated through holes (67-1, 67-2) which connect the upper ground plate (65) and the intermediate ground plate (68);

at least two columns of lower plated through holes (67-3, 67-4) which connect the lower ground plate (64) and the intermediate ground plate (68).

14. A high-frequency circuit apparatus according to claim 13, wherein the rows of the first plated through holes (66-1, 66-2) and the ground plates (64, 65) constitute a waveguide which prevents an interference with a signal external to the high-frequency circuit apparatus;

the upper plated through holes (67-1, 67-2), those of the first plated through holes that are located on an extension of the upper plated through holes, and the intermediate ground plate (68) constitute a first waveguide resonator whose resonance frequency is identical to a frequency in a signal frequency band of one of the two high-frequency circuits (62, 63) and which prevents signals in the signal frequency band of the high-frequency circuit from passing therethrough, the lower plated through holes (67-3, 67-4), those of the first plated through holes that are located on an extension of the lower plated through holes, and the intermediate ground plate (68) constitute a second waveguide resonator whose resonance frequency is identical to a frequency in a signal frequency band of the other high-frequency circuit (62 or 63) and which prevents signals in the signal frequency band of the high-frequency circuit from passing therethrough.

15. A high-frequency circuit apparatus according to claim 14, wherein the two rows of the first plated through holes (66-1, 66-2) are spaced at a first distance (W);

the columns of the upper plated through holes (67-1, 67-2) are spaced at a second distance (L1);

the columns of the lower plated through holes (67-3, 67-4) are spaced at a third distance (L2);

the resonance frequency of the first waveguide resonator is determined in accordance with the first and second distances;

the first waveguide resonator has frequency characteristics which are determined in accordance with the number and the diameter of the upper plated through holes;

the resonance frequency of the second waveguide resonator is determined in accordance with the first and third distances;

the second waveguide resonator has frequency characteristics which are determined in accordance with the number and the diameter of the lower plated through holes.

16. A high-frequency circuit apparatus according to claim 13, further comprising a first conductor pattern (77) on the upper surface of the printed circuit board, which is electrically isolated from the upper ground plate (65); and, a first variable capacitance diode (75) which is connected to the first conductor pattern (77) and the upper ground plate (65) and whose capacitance is varied in accordance with a bias voltage applied to the first conductor pattern.

17. A high-frequency circuit apparatus according to claim 13, further comprising a second conductor pattern (78) on the lower surface of the printed circuit board, which is electrically isolated from the lower ground plate (64); and, a second variable capacitance diode (76) which is connected to the second conductor pattern (78) and the lower ground plate (65) and whose capacitance is varied in accordance with a bias voltage applied to the second conductor pattern.

* * * * *